United States Patent [19]
Wu et al.

[11] Patent Number: 5,795,805
[45] Date of Patent: Aug. 18, 1998

[54] FABRICATING METHOD OF DYNAMIC RANDOM ACCESS MEMORY

[75] Inventors: Der-Yuan Wu, Hsinchu; Jason Jenq, Pingtung, both of Taiwan

[73] Assignee: United Microelectronics Corporation, Hsinchu, Taiwan

[21] Appl. No.: 904,543

[22] Filed: Aug. 4, 1997

[51] Int. Cl.⁶ .................................................. H01L 21/8242
[52] U.S. Cl. ........................................ 438/253; 438/254
[58] Field of Search ................................ 438/238–256, 438/381–398

[56] References Cited

U.S. PATENT DOCUMENTS 5,354,705  10/1994  Mathews et al. .
5,494,841  2/1996  Dennison et al. .

Primary Examiner—Jey Tsai
Attorney, Agent, or Firm—Rabin & Champagne, P.C.

[57] ABSTRACT

A fabricating method of a dynamic random access memory is provided. The characteristic of the method is the formation of a dielectric layer to protect a polysilicon layer of hemispheric grains, and thus, the slurry residue from chemical-mechanical polishing process is avoided. In addition, the dielectric layer and the oxide layer can be removed by the same step of wet etching without an additional process. The exposure limitation is not restricted by the shrinkage of the devices. Therefore, the polysilicon layer of hemispherical grains can be removed precisely as expected.

11 Claims, 11 Drawing Sheets

FABRICATING METHOD OF DYNAMIC RANDOM ACCESS MEMORY

BACKGROUND OF THE INVENTION

1. Field of the Invention

The invention relates to a fabricating method of an integrated circuit device, and more particularly to a fabricating method of a dynamic random access memory (DRAM).

2. Description of the Related Art

DRAM is one of the most widely used devices in integrated circuits, especially in the information electronic manufactures. A DRAM consists of a metal-oxide semiconductor (MOS) transistor and a capacitor. A cross section view of a conventional DRAM is shown as FIG. 1. A substrate 10 including gates 11, spacers 12 around the side wall of the gates 11, sources/drains 13, field oxide layers 14, and a bit line 15 which is coupled with the sources/drains 13 is provided. An insulation layer 16, for example, a silicon oxide layer, is formed on the device. Contact windows 17 are formed in the insulation layer 16, and plugs 18 coupled with sources/drains 13 are formed in the contact windows 17. A polysilicon layer 19 is formed on the plug 18 as a lower electrode of the capacitor. On the polysilicon layers 19 and the insulation layer 16, a polysilicon layer of hemispherical grains 20 is formed. In the conventional DRAM, the polysilicon layer of hemispherical grains 20 is removed by photolithography and etching to obtain a single capacitor. Due to the trend of narrower and narrower linewidth, the distance between polysilicon layers are getting smaller and smaller, together with the limitation of exposure linewidth, to reduce the size of devices is difficult.

Thus, another DRAM structure is disclosed. Referring to FIG. 2A to FIG. 2D, another conventional fabricating method of a DRAM is presented. In FIG. 2A, gates 22, sources/drains 23, a field oxide layer 24, a spacer 25 around the side wall of the gates 22, and a bit line 26 are formed on a substrate 21. On the device, an insulation layer 27 and a silicon nitride layer 28 are formed. The silicon nitride layer 28 is patterned to form openings 29 on the sources/drains.

Referring to FIG. 2B, a silicon oxide layer 30 is formed on the silicon nitride layer 28 by plasma enhanced chemical vapor deposition. The silicon oxide layer 30 is patterned and then etched away. The insulation layer 27 under the opening 29 is removed and the sources/drains 23 are exposed. Thus, vias 31 are formed. On the silicon oxide layer 30 and the vias 31, a heavily doped polysilicon layer 32 is formed as a lower electrode of a capacitor. A heavily doped polysilicon layer of hemispherical grains 33 is formed on the polysilicon layer 32.

Referring to FIG. 2D, by wet etching, the silicon oxide 30 is removed. An oxide layer/nitride layer/oxide layer 34, for example, TiN and $Ta_2O_5$ is formed. A polysilicon layer 35 is formed on the surface of the oxide layer/nitride layer/oxide layer 34 as an upper electrode of the capacitor.

In the above mentioned fabricating method of a DRAM, during the chemical-mechanical polishing process (CMP) for removing the polysilicon layer of hemispherical grains of 33 and the heavily doped polysilicon layer 32, the slurry residue contaminates the surface of the polysilicon layer 33, and thus, degrade the device quality.

SUMMARY OF THE INVENTION

It is therefore an object of the invention to provide a fabricating method of a DRAM by forming a dielectric layer to protect the surface of the polysilicon layer of hemispherical grains. Therefore, the contamination from the slurry residue of CMP process is prevented.

It is another object of the invention to provide a fabricating method of a DRAM. By CMP and etching back steps, the polysilicon layer of hemispherical grains and the heavily doped polysilicon layer are removed.

It is another object of the invention to provide a fabricating method of a DRAM. The oxide layer and the dielectric layer can be removed without an additional step.

It is still the other object of the invention to provide a fabricating method of a DRAM. The polysilicon layer of hemispherical grains can be removed without being limited by the shrinkage of the devices and the exposure limitation.

The further objects, as well as the advantages and purpose of the invention, will be set forth in part in the description which follows, and in part will be obvious from the description, or may be learned by practice of the invention. The advantages and purpose of the invention will be realized and attained by the elements and combinations particularly pointed out in the appended claims.

To achieve the objects and advantages, and in accordance with the purpose of the invention, as embodied and broadly described therein, the invention is directed a fabricating method of a DRAM comprising first that a substrate is provided. On the substrate, there is at least a MOS device region which comprises a gate region, a spacer around the side wall of the gate region, a source/drain region, and a field oxide layer. An insulation layer is formed on the substrate and patterned to form a first opening to expose the surface of the source/drain region. A first heavily doped polysilicon layer and a tungsten silicide layer are formed in sequence. The opening is thus filled with the first heavily doped polysilicon and the tungsten silicide. The first heavily doped polysilicon layer and a tungsten silicide layer are patterned to form a bit line which is coupled with the source/drain region through the opening. On the insulation layer and the bit line, a first oxide layer and a first dielectric layer are formed in sequence, and the first dielectric layer is planarized by a step of flow. On the first dielectric layer, a silicon nitride layer is formed and patterned to form a second opening and expose the first dielectric layer. On the surface of the silicon nitride layer, a second oxide layer is formed and patterned into second openings in which the first oxide layer and the insulation layer are removed to form vias, and the source/drain region is exposed. On the above exposed surfaces, a second heavily doped polysilicon layer and a polysilicon layer of hemispherical grains are formed in sequence. On the polysilicon layer of hemispherical grains, a second dielectric layer is formed with which vias are filled. In addition, the second dielectric layer is thicker than the second oxide layer. The second dielectric layer, the polysilicon layer of hemispherical grains, and the second heavily doped polysilicon layer are removed with the second oxide layer as a stop layer. By wet etching, the second oxide layer and the second dielectric layer are removed with the silicon nitride layer as a stop layer.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of the specification, illustrate on embodiment of the invention and together with the description, serve to explain the principles of the invention. In the drawings, FIGS. 1 (Prior Art) is a cross section view of one conventional fabricating methods of DRAMs.

DESCRIPTION OF THE PREFERRED EMBODIMENT

Figure 1:
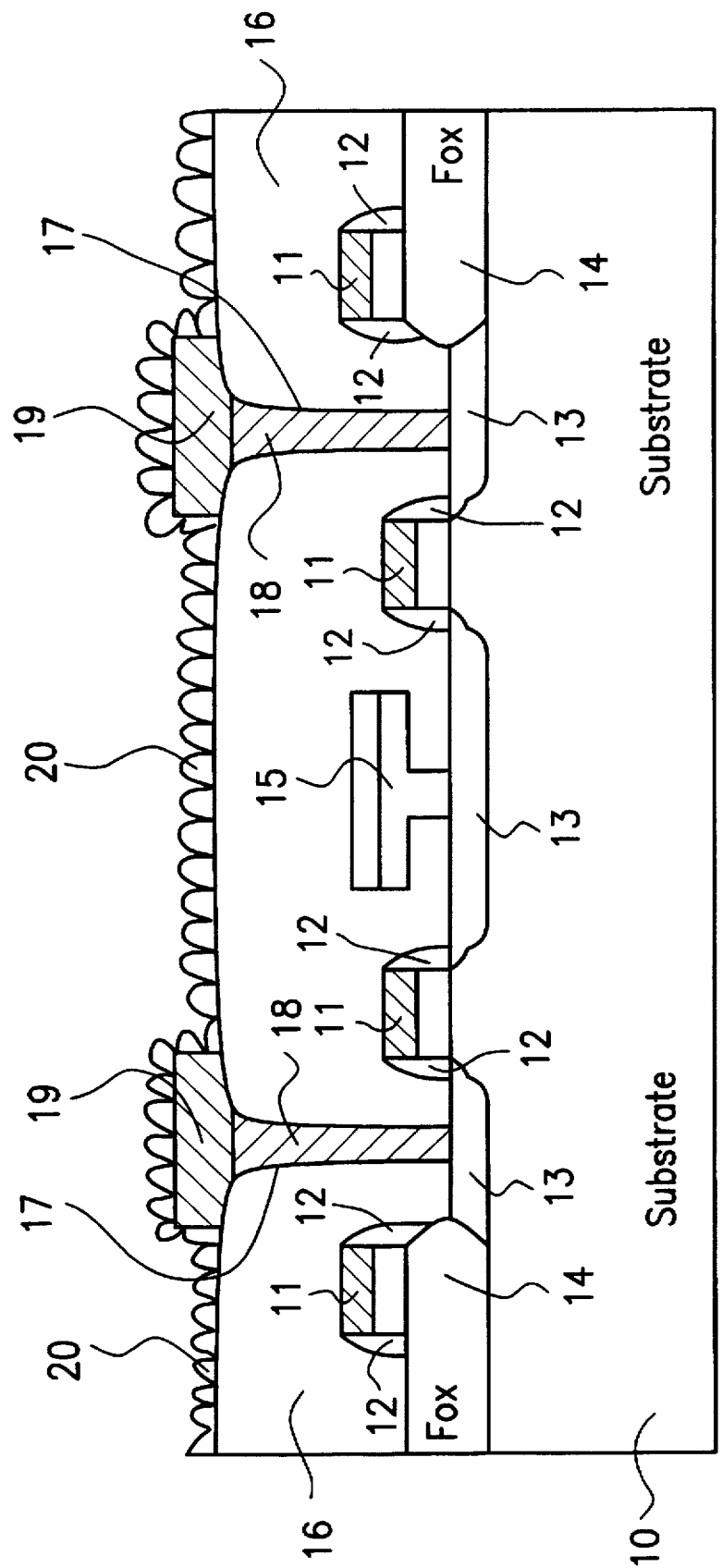
Figure 2A:
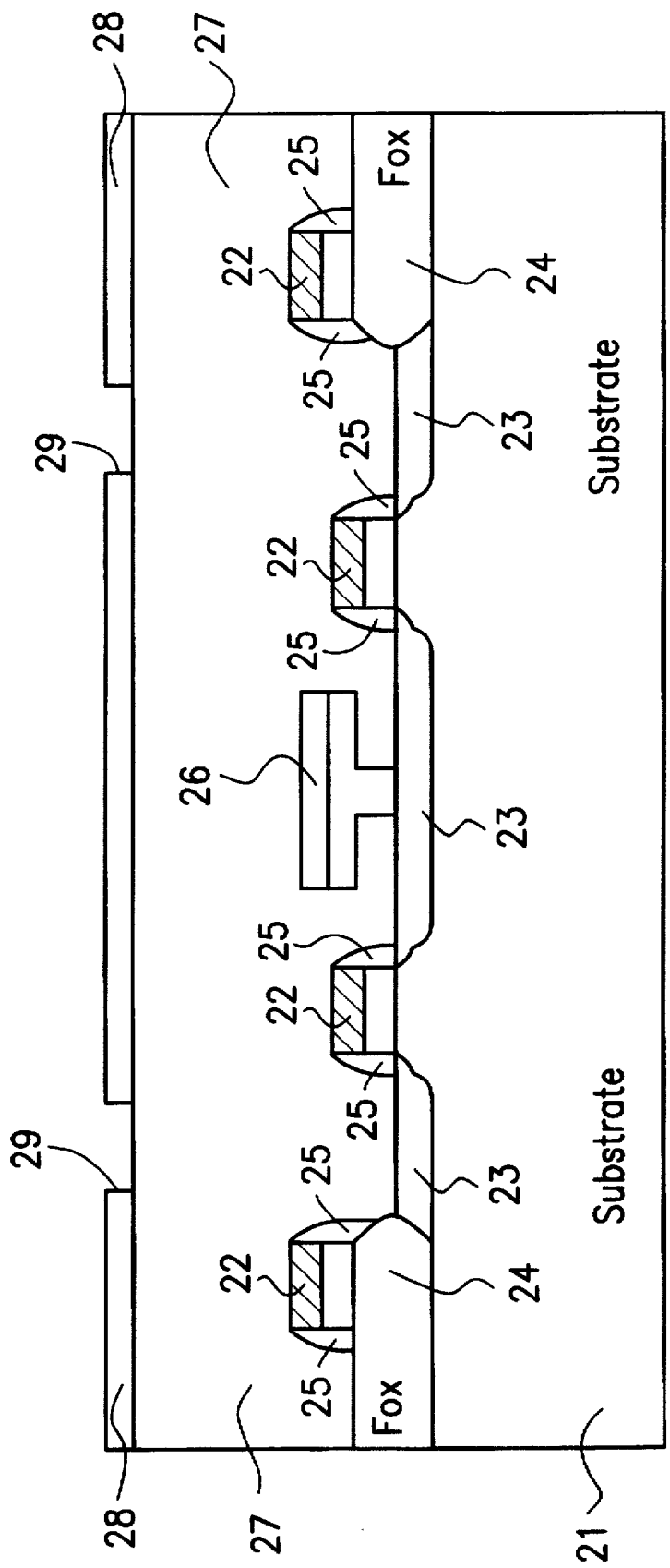
FIGS. 2A to 2D (Prior Art) are cross section views of another conventional fabricating methods of DRAMs.
Figure 2B:
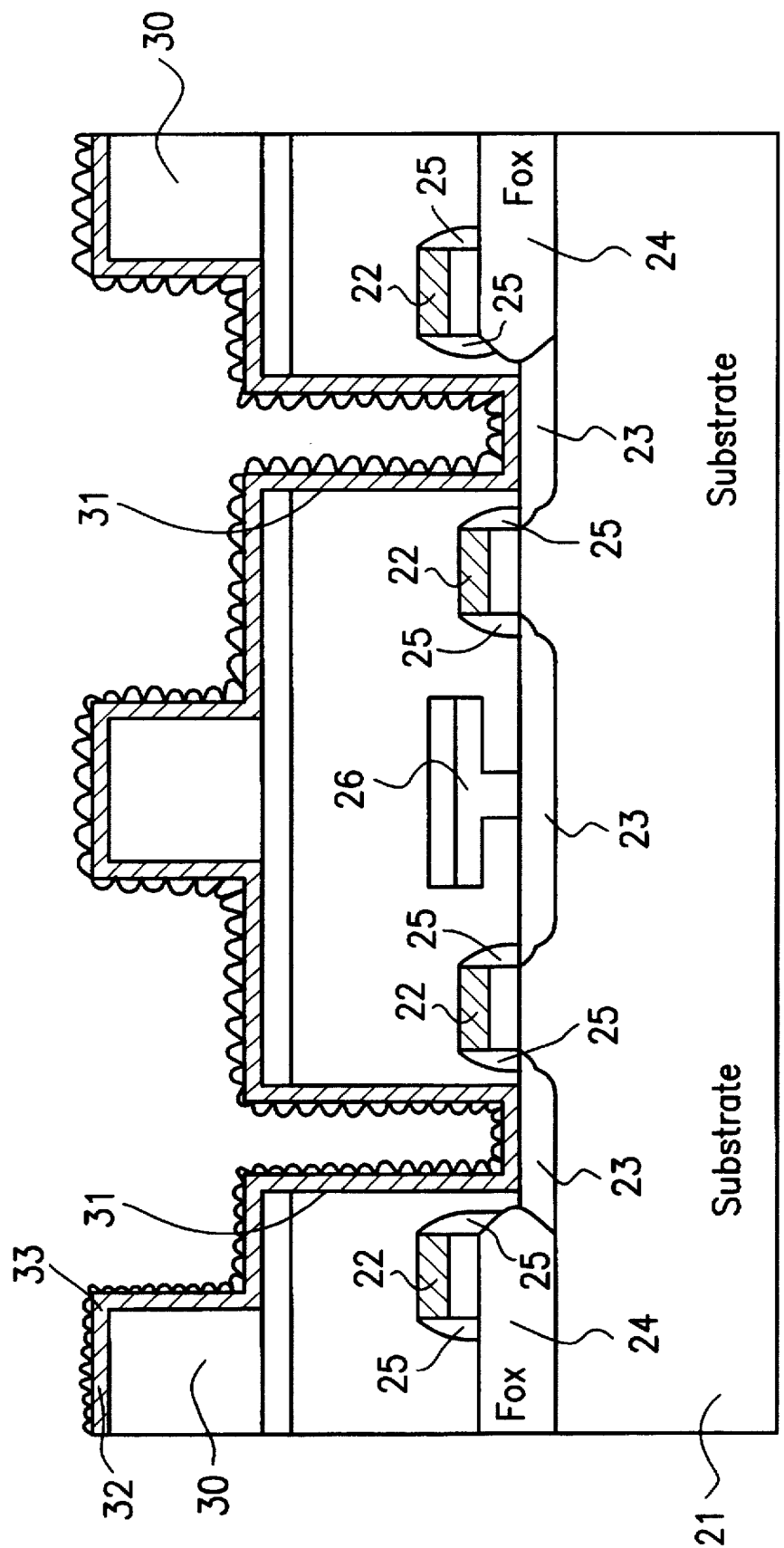
Figure 2C:
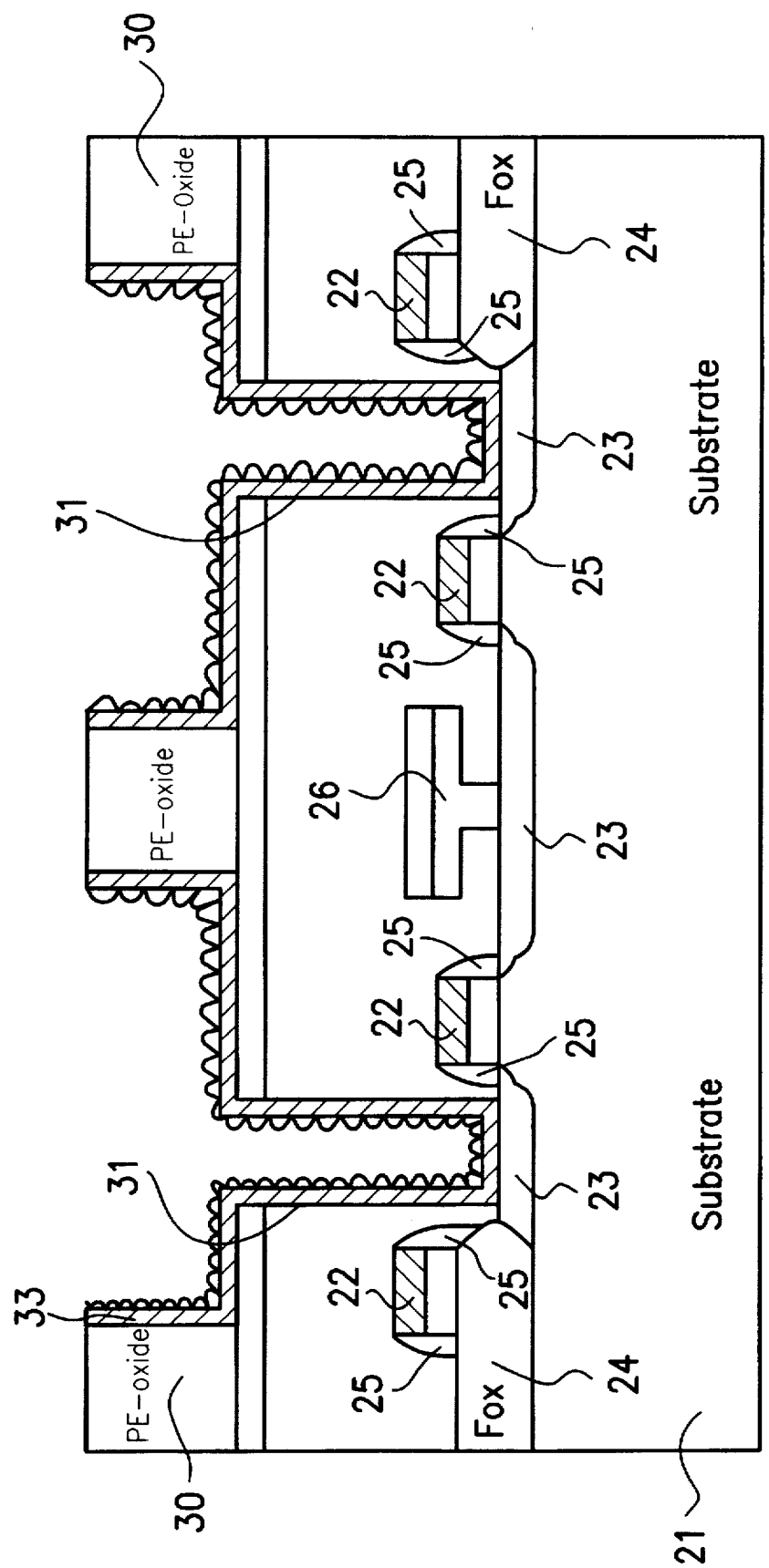
Figure 2D:
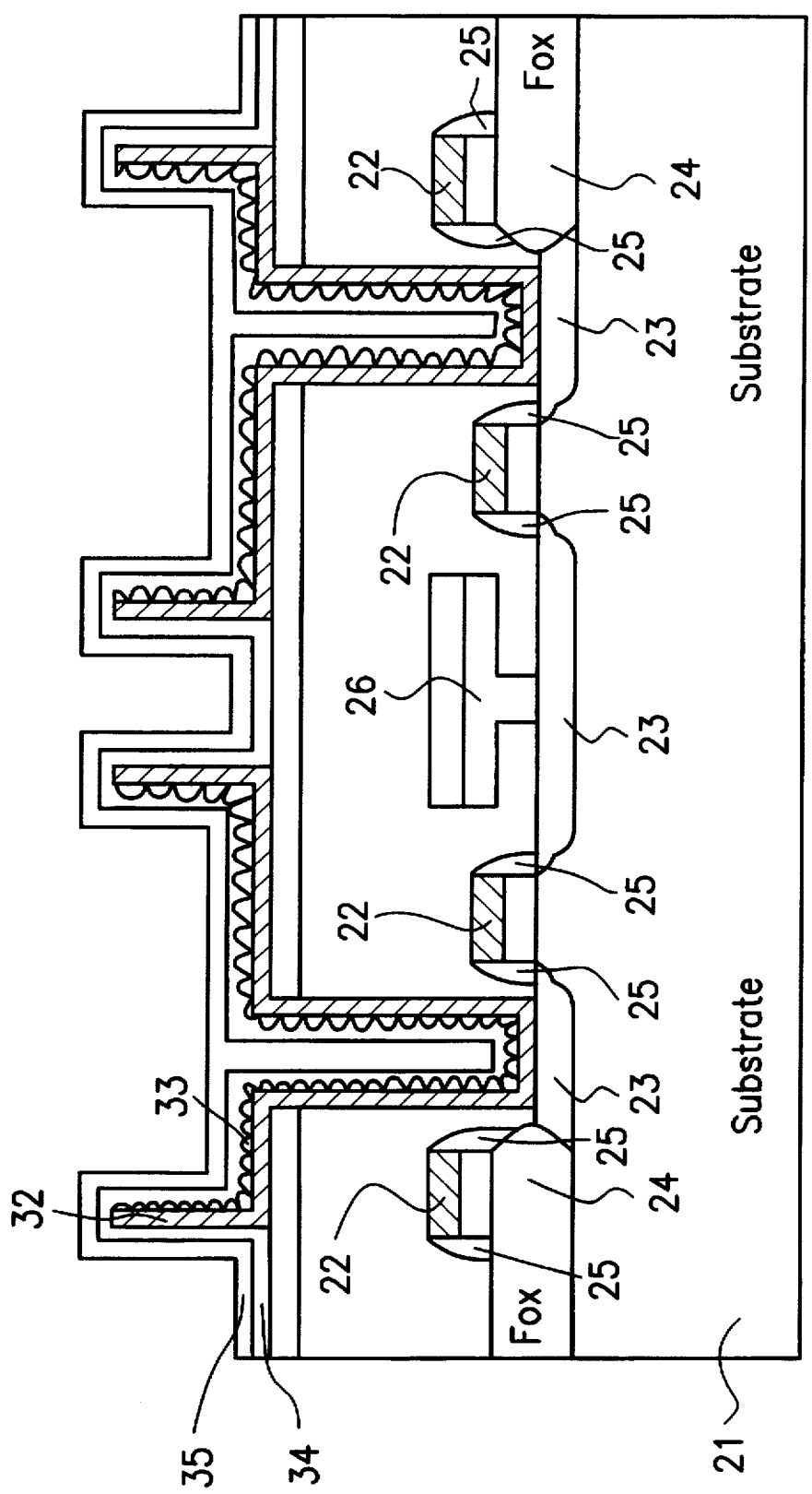

FIG. 3A to FIG. 3F show a fabricating method of a DRAM in one preferred embodiment according to the invention. A substrate 40, such as a P-type substrate, on which there is at least a MOS is provided. The MOS comprises a gate 41, a spacer 42 around the side wall of the gate 41, a source/drain 43, and a field oxide layer 44. An insulation layer 46, for example, a silicon oxide layer formed by low pressure chemical vapor deposition with a reactant gas of tetraethylorthosilicate glass is formed with a thickness of about 1500Å on the substrate 40. The insulation layer 46 is planarized by a step of flow at about 800° C. The insulation layer 46 is then patterned to form an opening 47 through which the source/drain 43 is exposed.

Figure 3A:
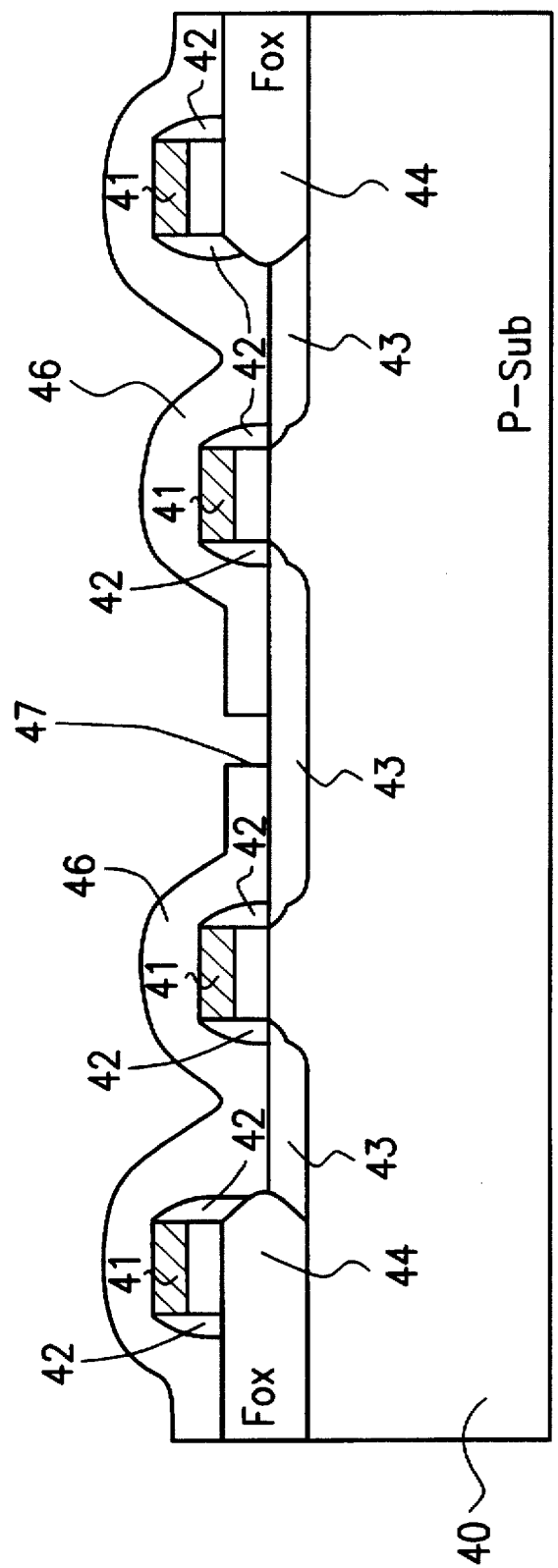
FIGS. 3A to 3F present one preferred embodiment according to the invention.
Figure 3B:
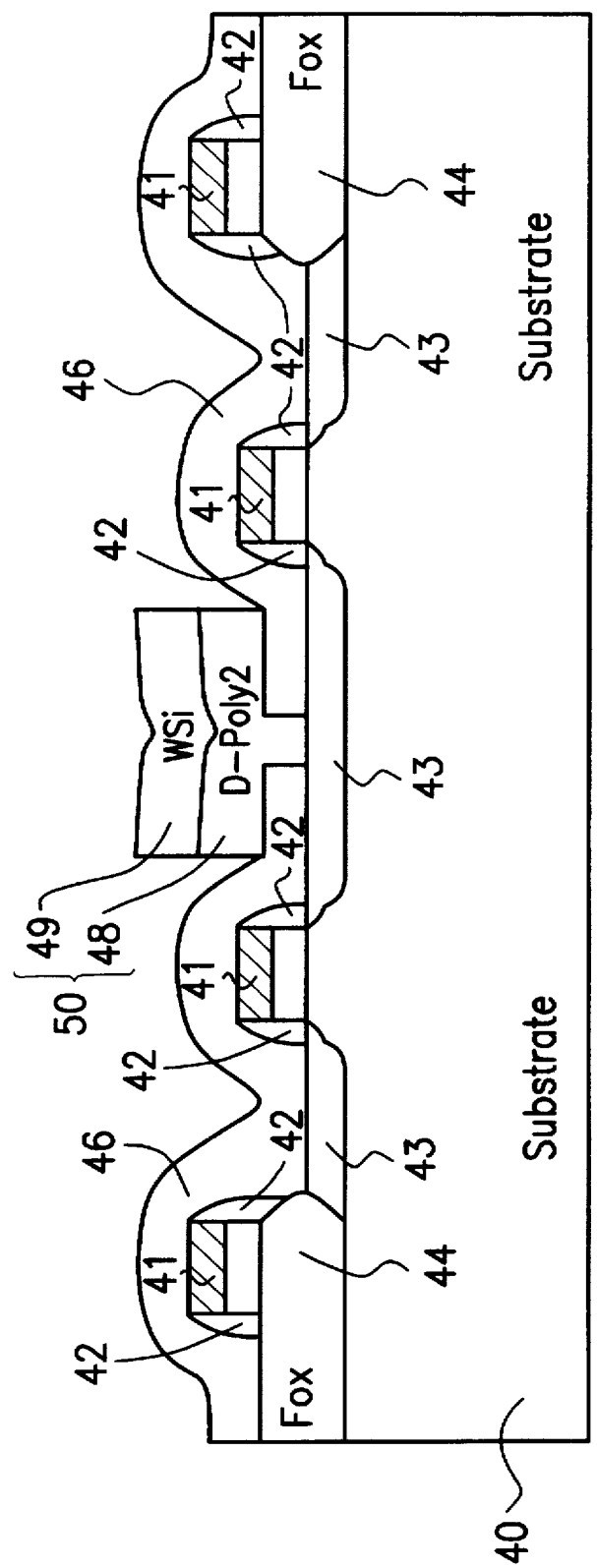

Referring to FIG. 3B, a doped polysilicon layer 48 and a tungsten silicide layer 49 are formed over the substrate 40 and filled the opening 47. Meanwhile, the doped polysilicon layer 48 and the tungsten silicide layer 49 are patterned to form a bit line 50. The bit line 50 is coupled with the source/drain 43 through the opening 47.

Figure 3C:
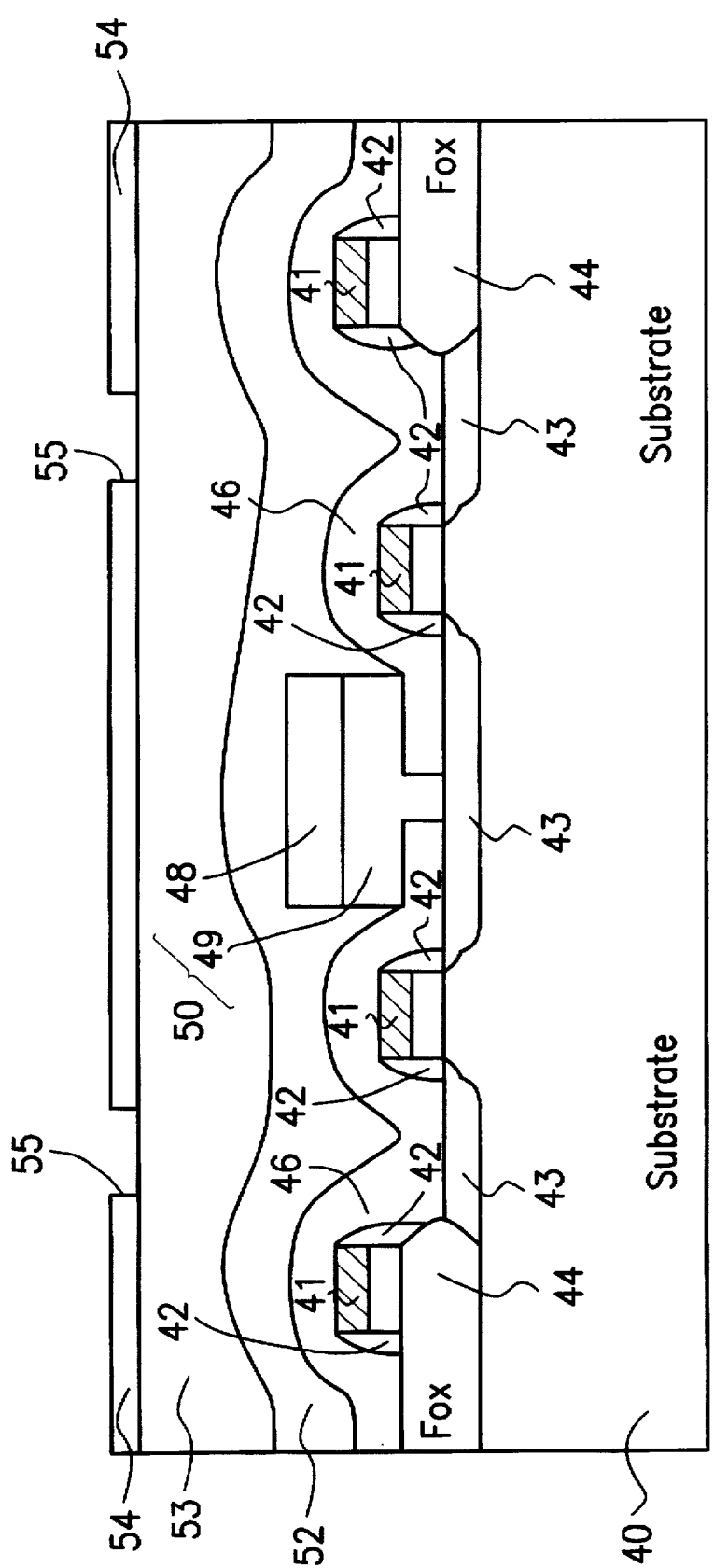

Referring to FIG. 3C, on the insulation layer 46 and the bit line 50, an oxide layer 52 and a dielectric layer 53 are formed. The oxide layer 52 is, for example, a silicon oxide layer formed by atmosphere pressure chemical vapor deposition, and the dielectric layer 53 is, for example, a borophosphosilicate glass layer. After the step of flow, the dielectric layer 53 is planarized. A silicon nitride layer 54 is formed on the dielectric layer 53. The silicon nitride layer 54 is patterned to form openings 55 through which the dielectric layer 53 is exposed. The openings 55 are above the source/drain 43.

Figure 3D:
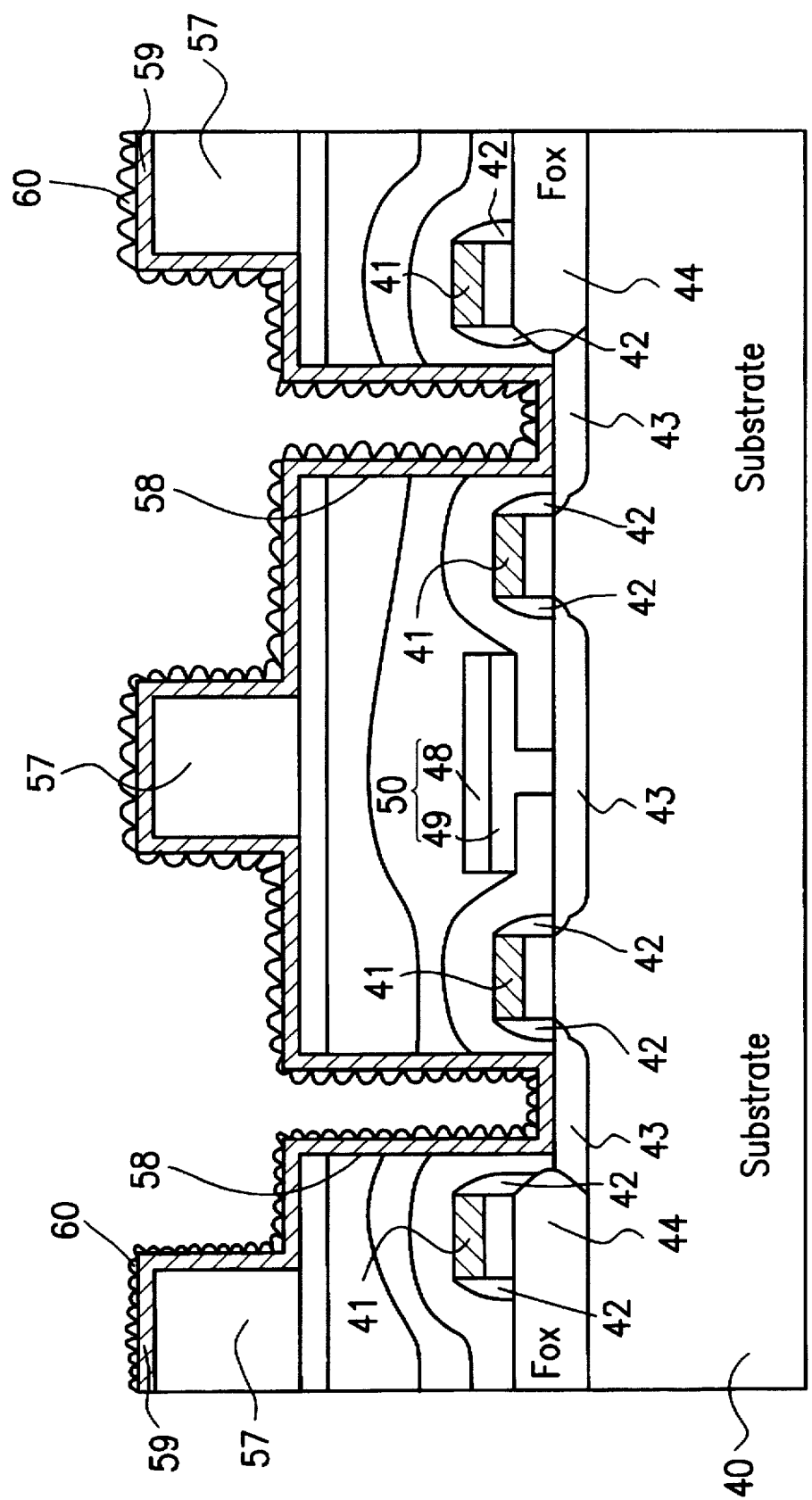

Referring to FIG. 3D, an oxide layer 57, for example, a silicon oxide layer formed by a plasma enhanced chemical vapor deposition, is formed on the silicon initride layer 54. The silicon oxide layer 57 is patterned and etched away, and through the openings 55, the dielectric layer 53, the oxide layer 52, and the insulation layer 46 are removed to expose the source/drain 43, and thus, vias 58 are formed. On the oxide layer 57 and the vias 58, a heavily doped polysilicon layer 59 is formed as a lower electrode of a capacitor. On the heavily doped polysilicon layer 59, a polysilicon layer of hemispherical grains 60 is formed.

Figure 3E:
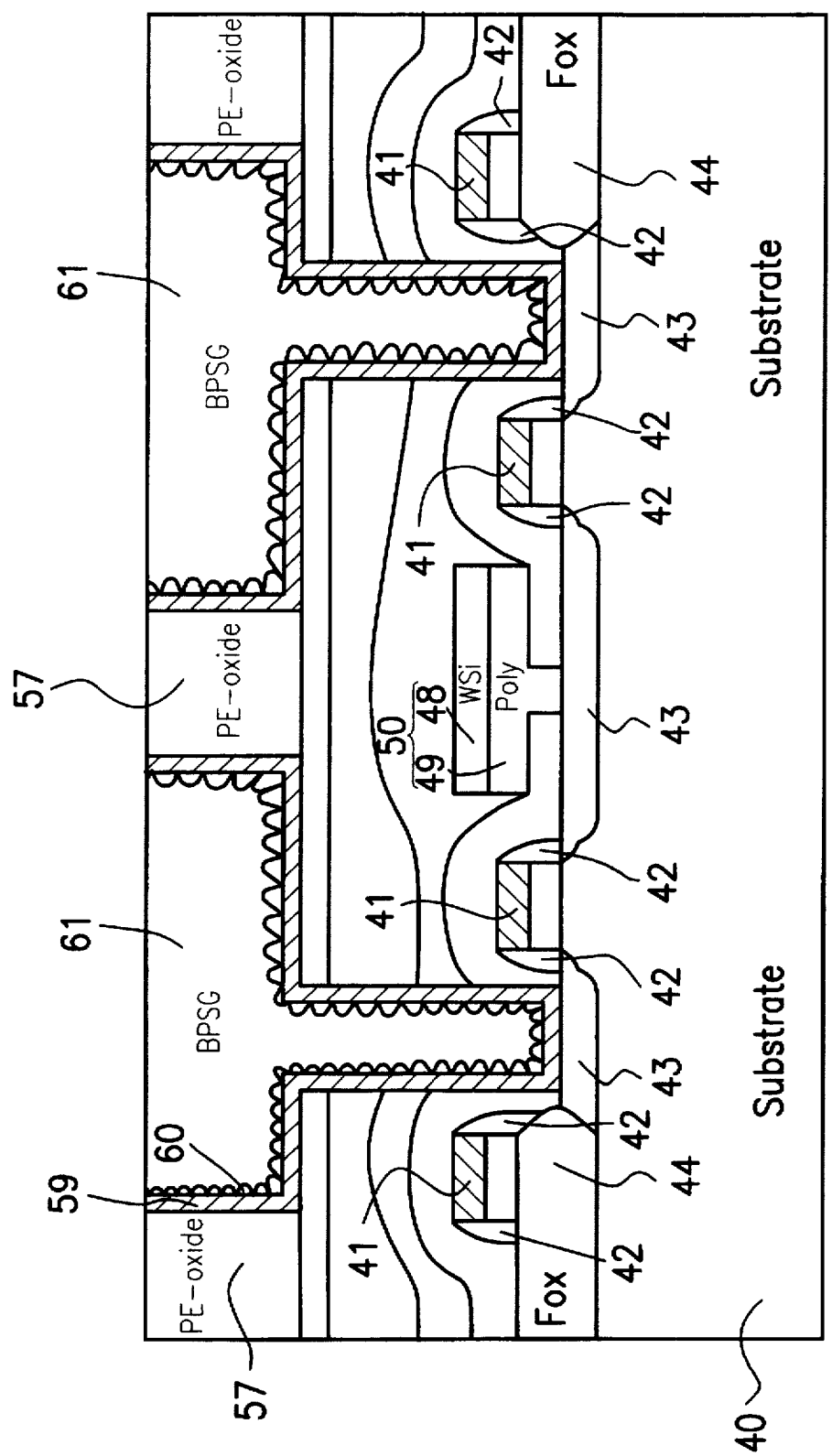
Figure 3F:
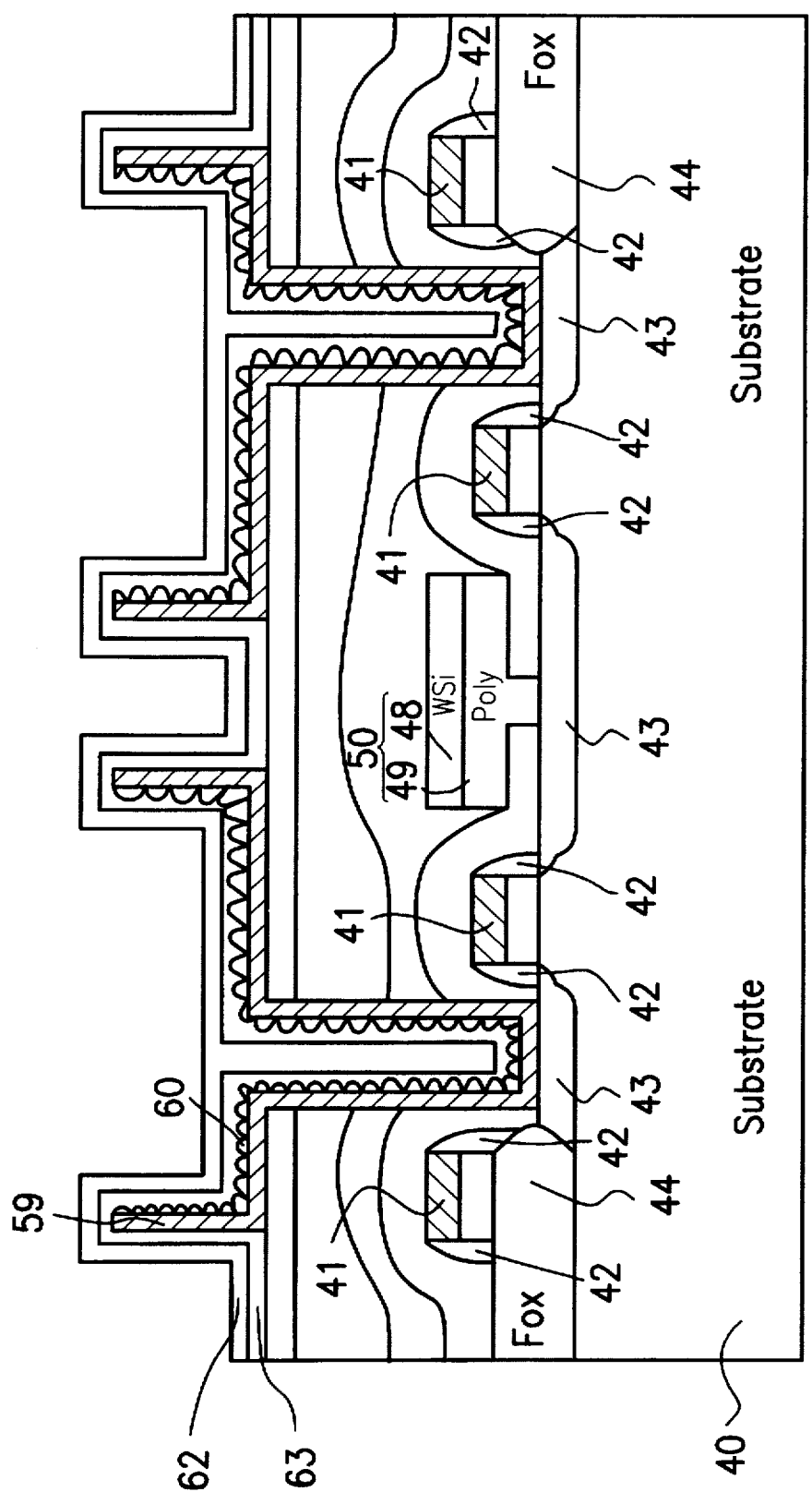

In FIG. 3E, a dielectric layer 61, for example, a borophosphosilicate glass layer, is formed on the polysilicon layer of hemispherical grains 60 and fill the vias 58. The dielectric layer 61 is thicker than the oxide layer 57. By etching back or CMP, the dielectric layer 61, the polysilicon layer of hemispherical grains 60, the heavily doped polysilicon layer 58 are removed with the oxide layer as a stop layer.

Referring to 3F, by using a buffer oxide etchant (BOE) with a ratio of 20:1, the oxide layer 57 and the dielectric layer 61 are removed with the silicon nitride layer 54 as a stop layer. An oxide layer/nitride layer/oxide layer 62, such as TiN and $Ta_2O_5$, is formed. A conductive layer 63, for example, a polysilicon layer is formed on the oxide layer/nitride layer/oxide layer 62 as the upper electrode of the capacitor.

According to the invention, the advantages of the fabricating method of a DRAM described in the above preferred embodiment are as follows.

1. By the formation of the dielectric layer 61 on the polysilicon layer of hemispherical grains 59, the polysilicon layer of hemispherical grains 59 is protected from being contaminated by the slurry residue from CMP in the conventional method is avoided.
2. The dielectric layer 61 and the oxide layer 57 can be removed by the same step of wet etching without additional process.
3. The method can be applied in the fabrication of devices with growing integration. Due to the shorter and shorter distance between the devices, the difficulty to define a polysilicon layer of hemispherical grains by photolithography and etching in the conventional method is improved.

Other embodiments of the invention will apparent to those skilled in the art from consideration of the specification and practice of the invention disclosed herein. It is intended that the specification and examples to be considered as exemplary only, with a true scope and spirit of the invention being indicated by the following claims.

What is claimed is:

1. A fabricating method of a dynamic random access memory, comprising:

providing a substrate including at least a metal oxide semiconductor which comprises a gate, a spacer around a side wall of the gate, a source/drain, and a field oxide layer;

forming and patterning an insulation layer to form a first opening therein, and to expose a part of the source/drain;

forming and patterning a first heavily doped polysilicon layer and a tungsten silicide layer to form a plurality of openings therein on the substrate;

patterning the first heavily doped polysilicon layer and the tungsten layer to form a bit line which coupling with the source/drain by the first opening;

forming a first oxide layer and a first dielectric layer on the insulation layer and the bit line;

planarizing the first dielectric layer by a step of flow;

forming and patterning a silicon nitride to form a plurality of second openings therein on the first dielectric layer, and to expose the first dielectric layer;

forming and patterning a second oxide layer;

removing the first dielectric layer, the first oxide layer, and the insulation layer within the second openings to form a plurality of vias, and to expose the source/drain;

forming a second heavily doped polysilicon layer of hemispherical grains over the substrate;

forming a second dielectric layer on the second heavily doped polysilicon layer of hemispherical grains;

filling the vias with the second dielectric layers which is thicker than the second oxide layer;

removing the second dielectric layer, the polysilicon layer of hemispherical grains and the second heavily doped polysilicon layer with the second oxide layer as a stop layer; and removing the second oxide layer and the second dielectric layer by wet etching with the silicon nitride layer as a stop layer.

2. The method according to claim 1, wherein the insulation layer is a silicon oxide layer formed by low pressure chemical vapor deposition with a tetraethylorthosilicate as a reactant gas.

3. The method according to claim 1, wherein the insulation layer is planarized by the step of flow at about 800° C.

4. The method according to claim 1, wherein the first oxide layer is a silicon oxide layer formed by atmosphere pressure chemical vapor deposition.

5. The method according to claim 1, wherein in the first dielectric layer is a borophosphosilicate glass layer.

6. The method according to claim 1, wherein the second openings are above the source/drain.

7. The method according to claim 1, wherein the second oxide layer is a silicon oxide layer formed by plasma enhanced chemical vapor deposition.

8. The method according to claim 1, wherein in the second dielectric layer is a borophosphosilicate glass layer.

9. The method according to claim 1, wherein in the second dielectric layer, the polysilicon layer of hemispherical grains, and the second heavily doped polysilicon layer are removed by etching back.

10. The method according to claim 1, wherein in the second dielectric layer, the polysilicon layer of hemispherical grains, and the second heavily doped polysilicon layer are removed by a chemical-mechanical polishing process.

11. The method according to claim 1, wherein in the wet etching is performed by using a buffer oxide etchant with a ratio of 20:1.

* * * * *